United States Patent [19]

Izumi et al.

[11] Patent Number: 5,571,375
[45] Date of Patent: Nov. 5, 1996

[54] METHOD OF REMOVING NATIVE OXIDE FILM FROM A CONTACT HOLE ON SILICON WAFER

[75] Inventors: Akira Izumi; Takeshi Matsuka, both of Kyoto, Japan

[73] Assignee: Dainippon Screen Mfg. Co., Ltd., Japan

[21] Appl. No.: 929,678

[22] Filed: Aug. 13, 1992

[30] Foreign Application Priority Data

Aug. 20, 1991 [JP] Japan .................................. 3-235404

[51] Int. Cl.$^6$ .............................. B44C 1/22; C03C 15/00; C03C 25/06
[52] U.S. Cl. .................................. 156/646.1; 156/653.1; 156/657.1; 156/345; 134/3; 134/31; 252/79.1; 252/79.3; 252/79.4
[58] Field of Search ............................. 156/643, 646, 156/643.1, 646.1

[56] References Cited

U.S. PATENT DOCUMENTS

| | | | |
|---|---|---|---|
| 5,022,961 | 6/1991 | Izumi et al. | 156/646.1 |
| 5,100,495 | 3/1992 | Ohmi et al. | 156/646.1 |
| 5,112,437 | 5/1992 | Watanabe et al. | 156/646.1 |

FOREIGN PATENT DOCUMENTS

| | | | |
|---|---|---|---|
| 52-56869 | 10/1977 | Japan . | |
| 0148820 | 7/1986 | Japan | 156/646 |
| 0143428 | 6/1987 | Japan . | |
| 0165937 | 7/1987 | Japan . | |
| 63-283028 | 11/1988 | Japan . | |

OTHER PUBLICATIONS

Wolf, Silicon Processing for the VLSI Era, vol. 1, Lattice Press, 1986, pp. 532–534.
"Control of Native Silicon Oxide Growth" Morita et al., Faculty of Engineering, Tohoku University pp. 11–12 (with English translation).

Primary Examiner—R. Bruce Breneman
Assistant Examiner—Anita Alanko
Attorney, Agent, or Firm—Ostrolenk, Faber, Gerb & Soffen, LLP

[57] ABSTRACT

A method of removing a native oxide film on a main surface of a silicon wafer. The native oxide film is formed in a contact hole of a patterned BPSG film or PSG film formed on the main surface. The method includes the steps of: placing a silicon wafer in a reaction chamber hermetically separated from outside atmosphere, and supplying mixed vapor of hydrogen fluoride and substantially high concentration alcohol to the reaction chamber. The step of supplying the mixed vapor of hydrogen fluoride and substantially high concentration alcohol preferably includes the steps of generating vapor from an azeotropic concentration mixture of hydrogen fluoride and alcohol, generating vapor of high purity alcohol solution and mixing these vapors. The vapor of hydrogen fluoride easily enters a small opening, which enables etching of the native oxide film. Since substantially high concentration alcohol exists in the reaction atmosphere, moisture the like by-product of etching is removed by the alcohol. Therefore, there is no possibility of excessively promoting etching of the BPSG film, etc. An alcohol layer is formed on the main surface after the etching, which prevents formation of a native oxide film on the main surface.

14 Claims, 9 Drawing Sheets

METHOD OF REMOVING NATIVE OXIDE FILM FROM A CONTACT HOLE ON SILICON WAFER

BACKGROUND OF THE INVENTION

1. Field of the Invention

The present invention relates to a method of removing a native oxide film formed on a surface of a silicon wafer in a semiconductor manufacturing process, and more particularly, to a method of removing a native oxide film in a contact hole formed by applying an insulation film such as a boro-phospho silicate glass film (BPSG film) or a phosphorus doped glass film PSG film) on a silicon wafer according to a desired pattern. The method provides excellent etching selectivity with respect to the BPSG film or the PSG film.

2. Description of the Related Art

A semiconductor device manufacturing process might produce various contaminations, which adversely affect the operation characteristics of the device. Various attempts have been made for cleansing a silicon wafer surface at each step of the manufacturing process.

A native oxide film ($SiO_2$) formed on a surface of a silicon wafer is one of the contaminations to the wafer surface. The native oxide film having a thickness of 10–20Å is readily formed on the wafer surface left in the atmosphere. The native oxide film is also formed in the steps of cleansing, etching and so on of the semiconductor device manufacturing process.

A native oxide film left on a wafer surface on which electrodes, such as sources and drains, are to be formed prevents normal functioning of the electrodes. In addition, the native oxide film has to be completely removed from the silicon wafer surface in order that a metallic electrode having a low contact resistance can be formed.

The following two methods are known for removing from the wafer surface a native oxide film, which is formed in a contact hole of the wafer surface through application of a patterned insulation film such as a BPSG film or a PSG film on the silicon wafer. A first method is etching the native oxide film on the wafer surface according to a wet method by using buffered hydrogen fluoride (mixture of ammonium fluoride, hydrogen fluoride and water). According to the first method, the silicon wafer surface is etched by immersing the silicon wafer in buffered hydrogen fluoride solution stored in a bath of a wet station, i.e., like ordinary wet cleansing. In this first method, the etching selectivity of the native oxide film to the insulation film, including a BPSG film or a PSG film, is controlled through adjustment of the hydrogen fluoride ionic strength by adding an appropriate amount of ammonium fluoride to the buffered hydrogen fluoride. The silicon wafer should be rinsed with pure water after the etching process.

A conventional second method of removing the native oxide film in a contact hole on a silicon wafer is by vapor etching the native oxide film on the wafer surface using a mixed vapor of hydrogen fluoride and water ($HF-H_2O$). In the second method, the $HF-H_2O$ mixed vapor is prepared by mixing vapor generated from separately prepared hydrogen fluoride and water, or by generating vapor from a previously prepared $HF-H_2O$ mixed solution. The $HF-H_2O$ mixed vapor is supplied into a chamber for etching in which the silicon wafer is housed, to etch the silicon wafer surface. The second method requires a rinsing process with pure water after the etching process because particles (reaction products) are liable to be produced in the etching process.

In the first method using the buffered hydrogen fluoride, however, particles in the chemical solution or pure water attach to the silicon wafer surface or inorganic/organic impurities in the chemical solution again attach to the wafer surface, causing deterioration of quality of the wafer. Because of the wet processing, the method is liable to cause a thicker native oxide film to form on the surface of the silicon wafer than a vapor processing. In this method, the etching selectivity of the native oxide film is controlled by preparing hydrogen fluoride ionic strength through the addition of ammonium fluoride to the buffered hydrogen fluoride. As a result, an etching rate of the insulation film, such as a BPSG film or a PSG film, is larger than that of the native oxide film. The etching rate of the native oxide film is set to be 10–15Å per minute, for example, and that of the BPSG film or the PSG film is 300–800Å per minute. Etching selectivity (an etching rate of a BPSG film or a PSG film/an etching rate of a native oxide film) of 20–80 is too large a value.

This method has another problem, that is, difficulty in introducing the chemical solution or pure water into a contact hole of sub-micron size having a diameter of 0.7–0.8 μm. In particular, with a contact hole of about 0.5–0.6 μm in diameter, the introduction is impossible unless a surfactant is used. Even if the chemical solution or pure water can be introduced into the contact hole, the introduction is not satisfactory. Therefore, the etching of the native oxide film in a contact hole on a silicon wafer according to the first method is slower than the ordinary etching processing. Furthermore, the first method requires a rinsing process as described above. Introduction of pure water into the contact hole is difficult and substitution of the liquid in the contact hole is accordingly unsatisfactory, which makes the desired rinsing processing impossible.

The second method, which uses $HF-H_2O$ vapor, also has a problem in that the etching rate of the BPSG film or the PSG film, which are insulation films, becomes extremely large. Hydrogen fluoride has its ions dissociated in the presence of water to produce fluoride ions $HF_2^-$. The fluoride ions act on silicon dioxide $SiO_2$, resulting in the etching of the silicon oxide film. The BPSG film or the PSG film, which are extremely hygroscopic, adsorbs much water if water exists in the atmosphere, as it does in the etching by $HF-H_2O$ vapor. The action of the water in particular promotes etching of the BPSG film or the PSG film, resulting in a significant increase in the etching rate. With a native oxide film having an etching rate of about 10–12Å per minute, for example, the etching rate of the BPSG film is not less than 1000–2000Å per minute. The etching selectivity, as defined above, also becomes as large as 80–200.

An extremely large etching rate of the BPSG film or the PSG film causes the following problem. With reference to FIG. 1, consider the case where a native oxide film 122 is to be removed from the surface of a silicon wafer 120. The native oxide film 122 covers an inner bottom surface of a contact hole 126 formed by a patterned BPSG film (or a PSG film) 124 provided on the surface of the silicon wafer 120 as shown in FIG. 1.

There is no particular problem in etching the BPSG film 124 in the direction of its thickness because the thickness of the film is about 1 μm, which is much larger than that of the native oxide film 122. However, if the sidewalls of the contact hole 126 formed by the BPSG film 124 are greatly etched (as indicated by dashed lines in FIG. 1), the contact hole 126 is enlarged by an etched area 128. Variation in size of the contact hole adversely affects the subsequent steps. In addition, an interface between the surface of the silicon wafer 120 and the BPSG film 124 could be damaged. These may cause significant defects in the quality of the wafer.

In the second method using $HF-H_2O$ mixed vapor, water is left in the atmosphere. Because particles are liable to be generated in the etching step as described above, a rinsing process by pure water is required.

SUMMARY OF THE INVENTION

An object of the present invention is therefore to provide a method of efficiently removing a native oxide film in a contact hole in a patterned BPSG film or PSG film formed on a main surface of a silicon wafer without seriously damaging the BPSG film or PSG film.

Another object of the present invention is to provide a method of efficiently removing a native oxide film formed in a contact hole in a BPSG film or PSG without excessively etching the BPSG film or PSG film.

A further object of the present invention is to provide a method of efficiently removing a native oxide film formed in a contact hole in a BPSG film or PSG film, without excessively etching the BPSG film or PSG film, and preventing the formation of the native oxide after the removal.

A method according to the present invention comprises a step of placing a semiconductor substrate in a reaction chamber separately from the atmosphere and a step of supplying a mixed vapor of hydrogen fluoride and a substantially high concentration alcohol to the reaction chamber.

Hydrogen fluoride vapor readily enters the contact holes in the BPSG film or PSG film to etch the native oxide film. Since the hydrogen fluoride in the contact holes can be easily replaced, efficient etching of the native oxide film is possible. Since substantially a high concentration alcohol exists in the reaction atmosphere, moisture obtained as a result of the etching is effectively removed from the system of the reaction. There is no possibility of the adsorption of water by the BPSG or PSG film and the excessive etching of the BPSG or PSG film. In addition, because an alcohol layer is formed on the main surface of the wafer after the etching, the re-formation of the native oxide film on the main surface is prevented.

As a result, it is possible to efficiently remove the native oxide film formed in the contact hole in the BPSG film or PSG film without excessively etching the BPSG or PSG film. The BPSG film or PSG film is not unduly damaged. It is also possible to prevent a native oxide film from being formed on the main surface of the wafer after the removal of the native oxide film.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
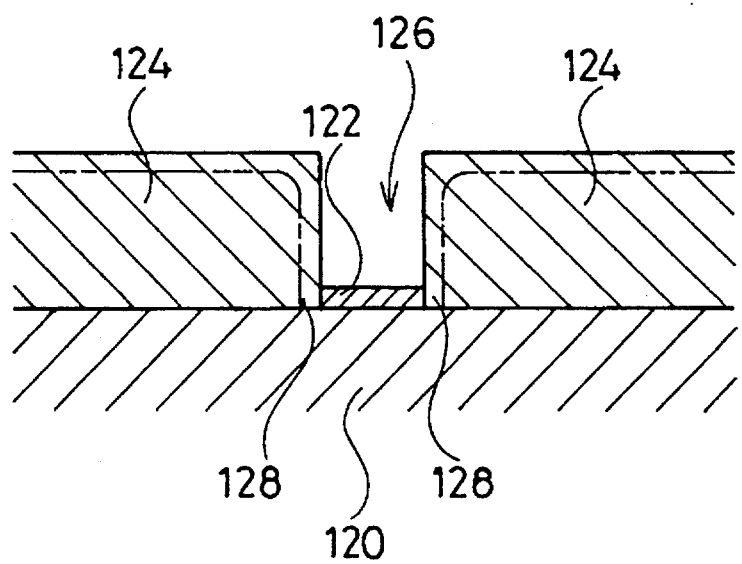
FIG. 1 is a partially expanded sectional view of a silicon wafer with a BPSG film having a contact hole formed on a surface thereof.
Figure 2:
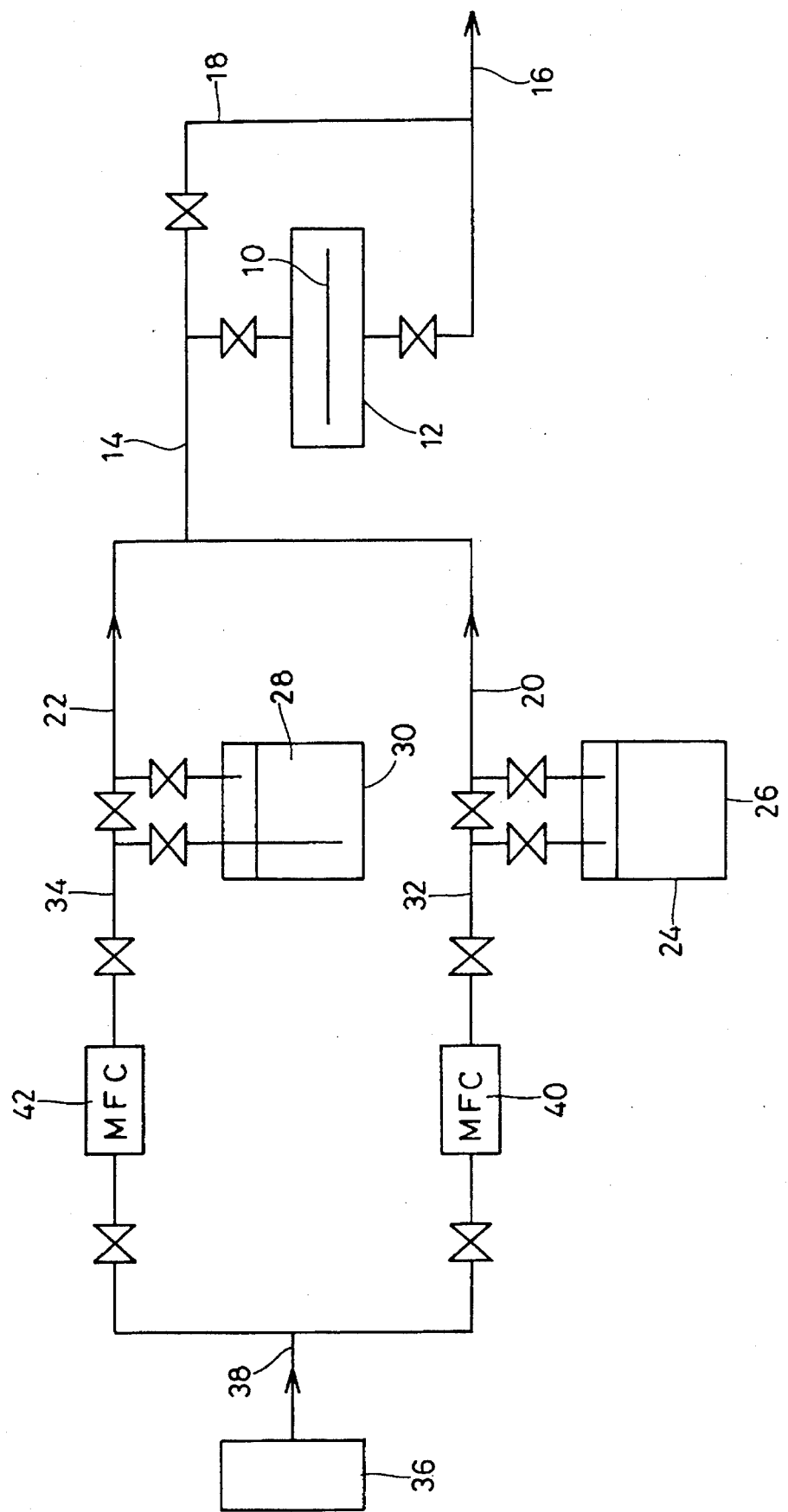
FIG. 2 is a schematic diagram showing one example of an arrangement of a device for implementing the method of the present invention.

FIG. 2 is a schematic diagram showing one example of an arrangement of a device for implementing the method of the present invention. In the figure, a container 12 houses a silicon wafer 10 with contact holes formed therein. Native oxide films to be etched and removed are formed in the contact holes. The container 12 is wholly formed by Teflon with its inner part hermetically separated from the outside. Connected to the container 12 are a vapor supply line 14 and an exhaust line 16 both made of Teflon. A by-pass line 18 is provided in parallel with the container 12. A door through which the silicon wafer is taken out or put in is provided on the side surface of the container 12, though it is not shown in FIG. 1. It is also possible to provide a load-lock chamber adjacent to the door or connect other process devices with a feed line so as to be in line with the container 12.

The supply line 14 is in communication with a supply opening of the container 12. Two lines 20 and 22 join the supply line 14. Both of the lines 20 and 22 are made of Teflon. One line 20 is connected so as to communicate with a tank 26 made of Teflon which stores a mixed solution 24 of hydrogen fluoride (HF) and methanol ($CH_3OH$). The other line 22 is connected so as to communicate with a tank 30 made of Teflon which stores a 100% methanol solution 28. The $HF-CH_3OH$ mixed solution 24 is an azeotropic composition solution with hydrogen fluoride of 38.5 weight % and methanol of 61.5 weight %. The mixed solution 24 has its composition maintained at all times.

Carrier gas supply lines 32 and 34 are connected so as to communicate with the tanks 26 and 30, respectively. The two supply lines 32 and 34 branch out of a shared line 38 in communication with a supply source 36 of nitrogen gas as a carrier gas. The supply lines 32 and 34 are respectively provided with mass flow controllers 40 and 42 for adjusting the amount of nitrogen that is supplied as the carrier gas to the tanks 26 and 30 from the nitrogen gas supply source 36 through the supply lines 32 and 34. Adjustment of the amount of nitrogen gas supplied by the mass flow controllers 40 and 42 results in adjustment of the amount of the mixed vapor of hydrogen fluoride and methanol that is supplied, and the amount of the methanol vapor that is supplied to the container 12. Provision of a methanol vapor supply line, in addition to the HF-CH$_3$OH mixed vapor supply line, enables control of the methanol vapor so that it is supplied to the container 12 at an extremely high concentration. As a result, methanol vapor can be supplied in excess to the container 12 as compared with the hydrogen fluoride vapor. It is possible to supply only the nitrogen gas, without being passed through the tanks 26 and 30, from the nitrogen gas supply source 36 into the container 12 by operating a valve so as to purge the inside of the container 12 after the etching processing, etc. If the concentration of the hydrogen fluoride HF in the HF-CH$_3$OH mixed solution 24 stored in the tank 26 is sufficiently decreased, it is not necessary to provide, as is described above, the tank 30 for storing only the methanol solution 28 so as to supply the methanol vapor to the container 12 through the line other than the hydrogen fluoride-methanol mixed vapor supply line.

The device of the above arrangement was placed in a chamber with an atmosphere temperature adjusted to 22° C. and the device was maintained at that temperature. In addition, because as one of the process conditions the alcohol concentration is set so as to be extremely high, dew could be formed midway on the methanol vapor supply line, thereby causing unstable flow control or the generation of mist. In order to avoid such a problem, the temperature at the methanol vapor supply side and the temperature inside the container 12, and the temperature inside container 12, and the temperature of the silicon wafer 10 itself were set to be the same or the temperature of the silicon wafer 10 could be set to be slightly higher than that of the former.

A silicon wafer with a contact hole formed therein is etched by using a device of such a structure as described above. The amount of hydrogen fluoride-methanol mixed vapor and the amount of methanol vapor supplied to the container 12 are optimized in order that the etching rate of the native oxide film is 10–20Å per minute and the etching rate of the BPSG film or the PSG film is 130–200Å per minute. This can reduce the amount of the BPSG film or the PSG film lost through etching at the time of removal of the native oxide film to about 100–200Å. As a result, it is possible to suppress variations in the size of the contact holes, and damage of the interface around the contact holes between the BPSG film or the PSG film and the silicon wafer surface.

The foregoing results are obtained for the following reasons:

When the mixed vapor of anhydrous hydrogen fluoride and alcohol is supplied to the silicon wafer in a container hermetically separated from ambient air, silicon dioxide (SiO$_2$) is removed from the surface of the silicon wafer in accordance with the following chemical reaction:

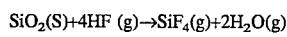

(S: solid phase, g: liquid phase)

In this reaction, alcohol is supplied to the system of reaction together with hydrogen fluoride, whereby ions of the hydrogen fluoride are dissociated to generate fluoride ions. The fluoride ions effectively act on SiO$_2$, so that the above-described reaction proceeds smoothly, thereby enhancing SiO$_2$ removal.

A BPSG film or a PSG film which forms an insulation film on a silicon wafer is highly hygroscopic. In the presence of water in the atmosphere as described above, the water promotes etching of the BPSG film or the PSG film, resulting in a significant increase in the etching rate. In the method of the present invention, however, no water is contained in the vapor which is to be supplied to the container in which the silicon wafer is stored, or etching is carried out in an atmosphere containing a high concentration alcohol vapor with the amount of water contained in the vapor suppressed so as to be small. Therefore, the etching of the BPSG film or the PSG film is not accelerated by the water. In addition, because an alcohol, in particular, methanol or ethanol, with a small molecular weight dissolves large quantities of water, water in the system of reaction, if any, is dissolved in the alcohol contained in a high concentration in the atmosphere, and is thereby efficiently taken out of the system of reaction. It is also, therefore, possible to avoid an effect of water, generated as a by-product during the etching reaction, onto the etching. The method of the present invention therefore enables an etching rate of the BPSG film or the PSG film to be reduced and an etching selectivity of the native oxide film to the BPSG film or PSG film to be improved.

In addition, according to the method of the present invention, since the amount of moisture in the atmosphere is suppressed so as to be small, as described in the foregoing, there is no possibility of undesired side reactions as expressed by the following reaction equations (1) and (2) and a reverse reaction of the etching as expressed by reaction equation (3). It is therefore less likely that colloidal metasilicic acid H$_2$SiO$_3$ and silicon dioxide SiO$_2$, which are products of these reactions, are left and re-attach themselves to the wafer surface to cause another contamination.

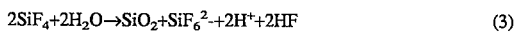

As a result, there is no necessity for rinsing the wafer with pure water after the etching processing. Furthermore, according to the method of the present invention, hydrogen fluoride readily penetrates, in the form of vapor, into the contact hole on a silicon wafer. Vapor in the contact hole can be readily replaced. As a result, the native oxide film in the contact hole on the silicon wafer is removed without problem.

The present invention also has a marked effect as described in the following.

It is known that growth of a native oxide film requires both oxygen and moisture (See for example, "Control of Native Si Oxide Film Formation", a technical report *Shingaku Giho*, Vol. 89, No. 111 of Institute of Electronics, Information and Communication Engineers of Japan pp. 11–12 issued Jun. 26, 1989 by the above-mentioned institute). In the method of the present invention, however, the mixed vapor of hydrogen fluoride and high concentration alcohol is supplied to a container, with the amount of moisture in the reaction atmosphere suppressed so as to be small, as described above. Therefore, re-oxidation of the surface of the silicon wafer because of the oxygen in the atmosphere hardly occurs after etching and removing the native oxide film. In addition, since high concentration alcohol vapor is supplied to the silicon wafer, the alcohol is left to cover the wafer surface after the native oxide film in the contact hole on the silicon wafer is completely removed. The alcohol itself is liable to produce a reductive atmosphere and hardly works as an oxidizer. The exposed surface of the silicon wafer after the removal of the native oxide film in the contact hole is therefore protected and prevented from re-oxidation by alcohol.

A layer of alcohol formed so as to cover the surface of the silicon wafer can be readily eliminated from the surface of the silicon wafer by evacuation, radiation of ultra-violet ray or heating. In other words, post-processing is easy.

Although a mixed vapor produced from the mixed solution 24 of hydrogen fluoride and methanol is supplied to the container 12 in the foregoing description, vapor of hydrogen fluoride produced from liquid hydrogen fluoride alone may be supplied. A hydrogen fluoride bomb may be alternatively used. In addition, the alcohol may be other than methanol, for example, ethanol, isopropyl alcohol, etc.

A plurality of test examples and results thereof by using the above-described apparatus will be described in the following. In each test, first sample wafers with native oxide films of 12Å in thickness formed on surfaces were prepared by immersing phosphorus doped n type silicon wafers with a resistivity of 2–8 Ω·cm into a boiled mixture of sulfuric acid and hydrogen peroxide water (in a volume ratio of 2:1) for 30 minutes. In addition, second sample wafers were prepared by forming BPSG films (or a PSG film) of 2500Å on surfaces of silicon wafers by an ordinary low pressure CVD method. The amounts of doped boron (B) and phosphorus (P) in the BPSG film were 1.8 mol % and 7.1 mol %, respectively.

In the test, an ultra high purity azeotropic composition HF-$CH_3OH$ mixed solution (HF: 38.5 weight %, $CH_3OH$: 61.5 weight %), HF-$C_2H_5OH$ mixed solution (HF: 40 weight %, $C_2H_5OH$: 60 weight %) and HF-IPA (isopropyl alcohol) mixed solution (HF: 40 weight %, IPA: 60 weight %), which were produced by Morita Kagaku Co., Ltd., were used as the hydrogen fluoride-alcohol mixed solution. The methanol and the ethanol used were ultra high purity products for electronic industrial use produced by NACALAI TESQUE, INC. The isopropyl alcohol used was an ultra high purity product for electronic industrial use produced by Mitsubishi Kasei Co. and the nitrogen ($N_2$) gas used was of ultra high purity grade produced by Nippon Sanso Co. and the buffered hydrogen fluoride used in the comparison test was an ultra high purity product for electronic industrial use produced by Morita Kagaku Co., Ltd.

Test 1

While maintaining the total flow amount of nitrogen gas (carrier gas) at 10 L per minute, which was to be introduced in the container 12 in which the silicon wafer 10 as each of the above samples was stored, the HF-$CH_3OH$ mixed vapor was supplied through the line 20 to the container 12, with a concentration of HF varied. Two types of gases were supplied through the line 22 to the container 12. One was nitrogen gas and the other was mixed gas of methanol vapor and nitrogen gas. The silicon wafer 10 was etched in each of the cases. The concentration of the methanol supplied to the container 12 was set to be 8.5–10.2 vol % as a whole.

Figure 3:
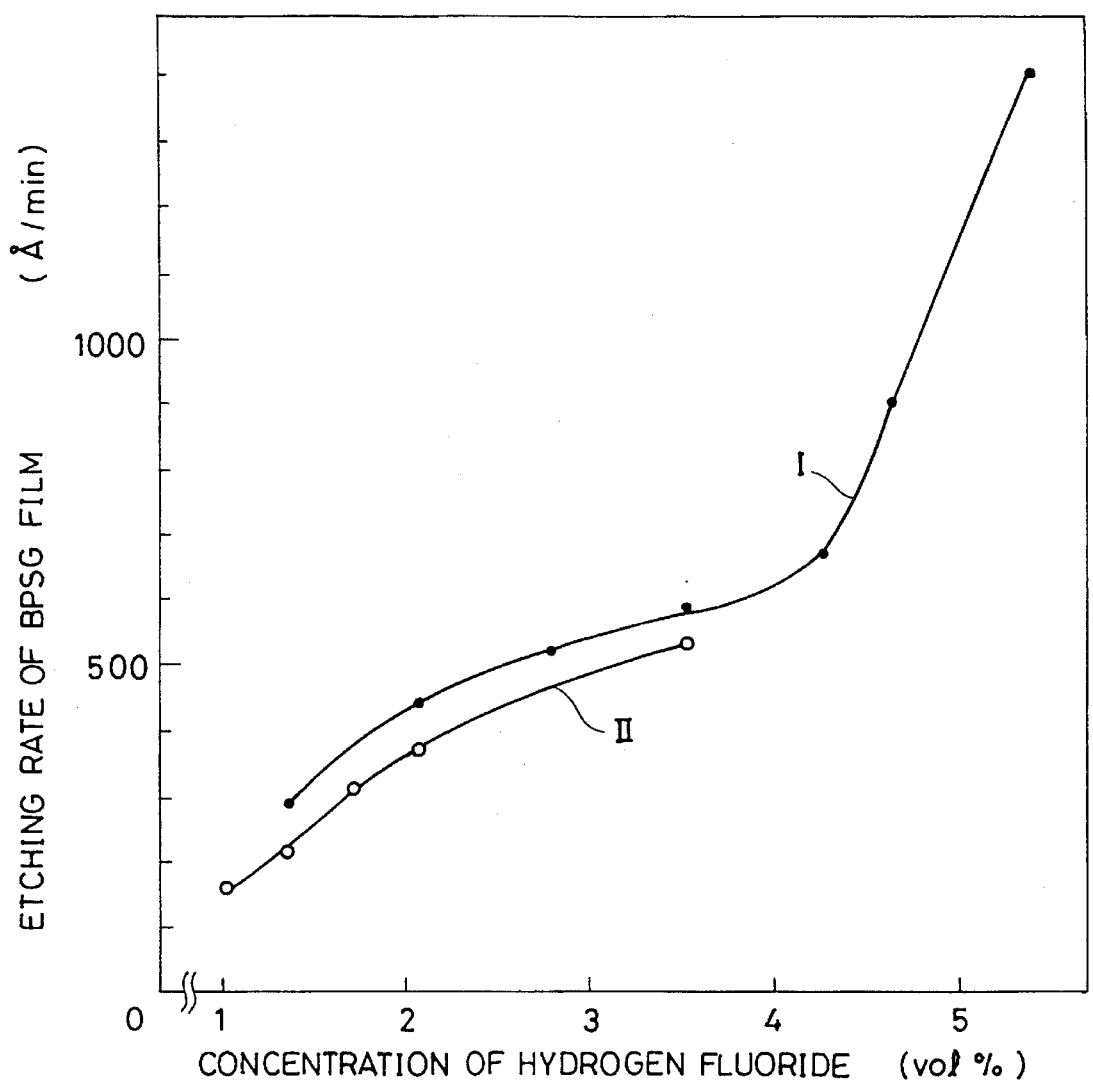
FIG. 3 is a graph showing the results of a first experiment in which the silicon wafer with the BPSG film formed thereon is etched according to the method of the present invention.
Figure 4:
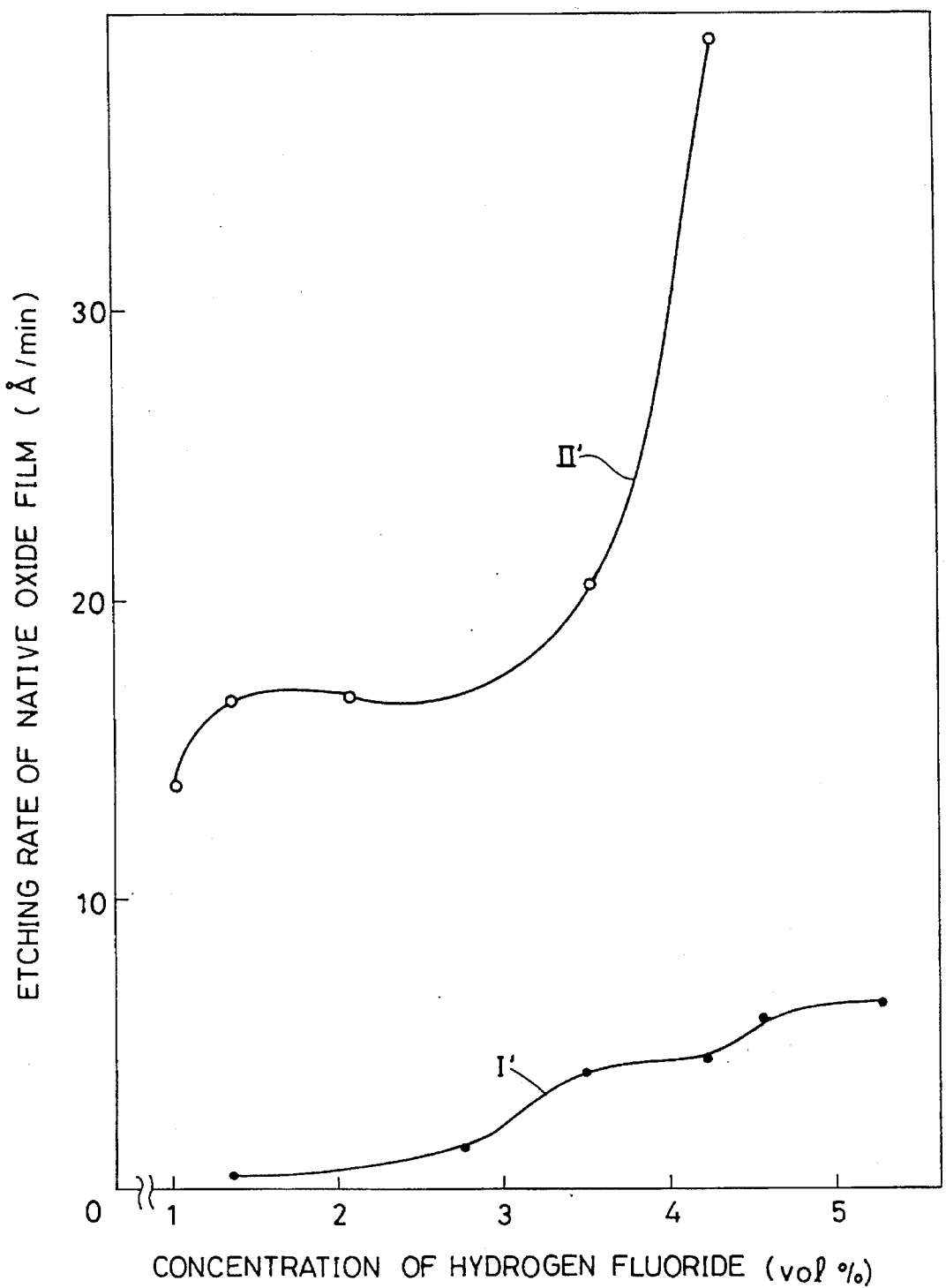
FIG. 4 is a graph showing the results of the first experiment in which a silicon wafer with a native oxide film formed on its surface is etched according to the method of the present invention.

The test results are shown in FIGS. 3 and 4. FIG. 3 shows the result of etching of sample silicon wafers with BPSG films formed on their surfaces. In FIG. 3, the curve I shows the result in the case where only the nitrogen gas was introduced through the line 22, while the curve II shows the result in the case where the methanol solution 28 in the tank 30 was bubbled by nitrogen gas and passed through the line 22 and methanol vapor was supplied to the container 12. FIG. 4 shows the result of etching of sample silicon wafers with native oxide films formed on their surfaces. In FIG. 4, the curve I' shows the result in the case where nitrogen gas was introduced through the line 22, while the curve II' shows a result in a case where methanol vapor was supplied to the container 12 through the line 22.

FIGS. 3 and 4 show that etching with a methanol concentration in the atmosphere in the container 12 increased by introduction of the methanol vapor through the line 22 (curves II, II') results in a slight reduction of an etching rate of a BPSG film and a significant increase in an etching rate of a native oxide film as compared with etching with a low methanol concentration (curves I, I'). With an increased methanol concentration, if hydrogen fluoride concentration were the same, etching rates of the BPSG film and the native oxide film were, for example, 200Å per minute and 13Å per minute, respectively, and its etching selectivity was about 15 (200/13).

Test 2

Figure 5:
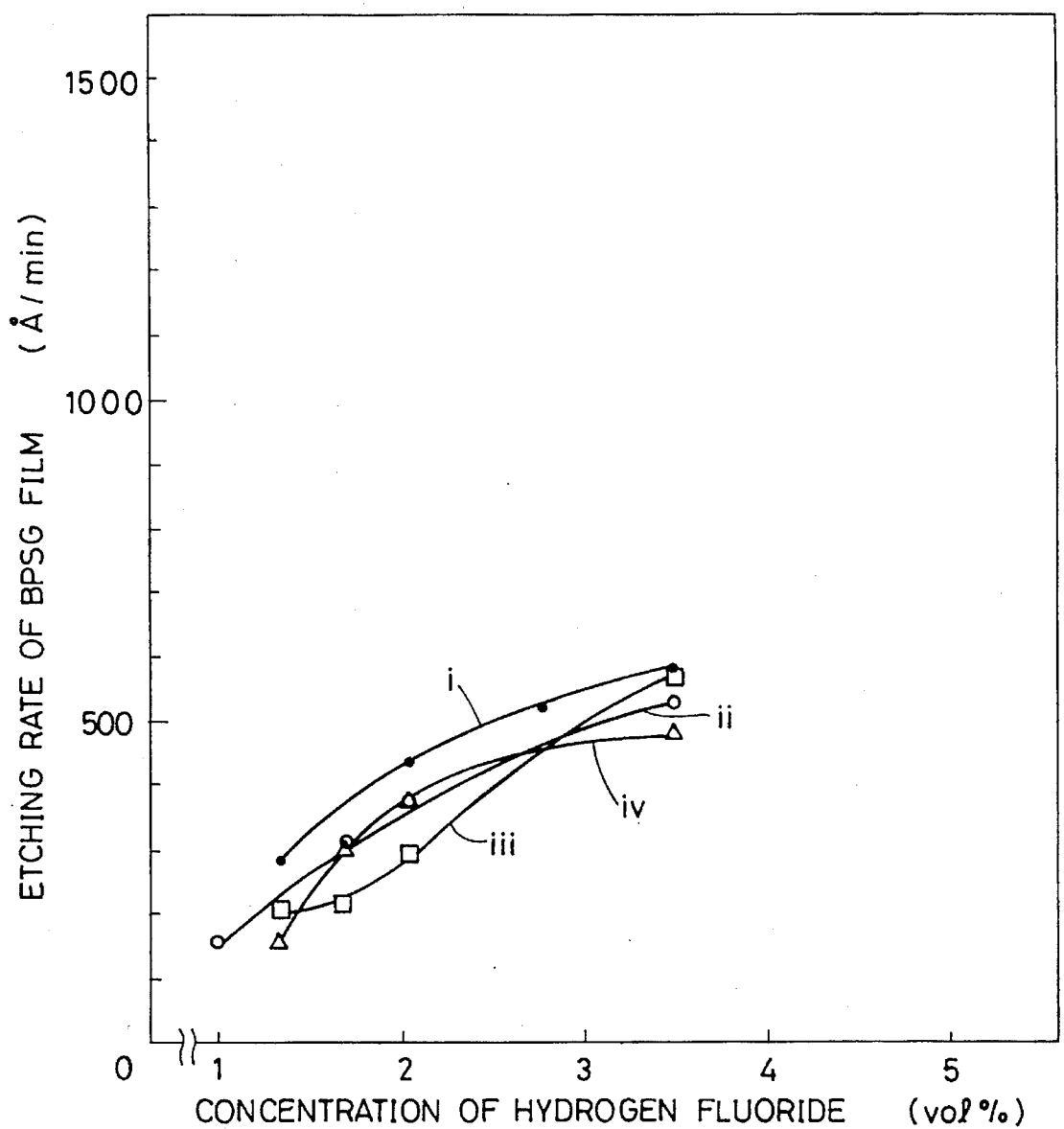
FIG. 5 is a graph showing the results of a second experiment in which a silicon wafer with a BPSG film formed on its surface is etched according to the method of the present invention.

The test 2 was conducted in a manner as described in the following. Under the same conditions as those of the test 1, HF-$C_2H_5OH$ mixed vapor or HF-IPA mixed vapor was supplied to the container 12 through the line 20. Meanwhile, ethanol vapor or IPA vapor was supplied to the container 12 through the line 22. Silicon wafers with BPSG films formed on their surfaces were etched as samples. The result is shown in FIG. 5. In FIG. 5, the curve i shows the result in a case where only the nitrogen gas was introduced through the line 22, the curve ii shows the result in a case where methanol vapor was introduced to the container 12 through the line 22 (the curves i and ii show the same result as those of the test 1), the curve iii shows the result in a case where ethanol vapor was introduced to the container 12 through the line 22, and the curve iv shows the result in a case where IPA vapor was introduced to the container 12 through the line 22.

Figure 6:
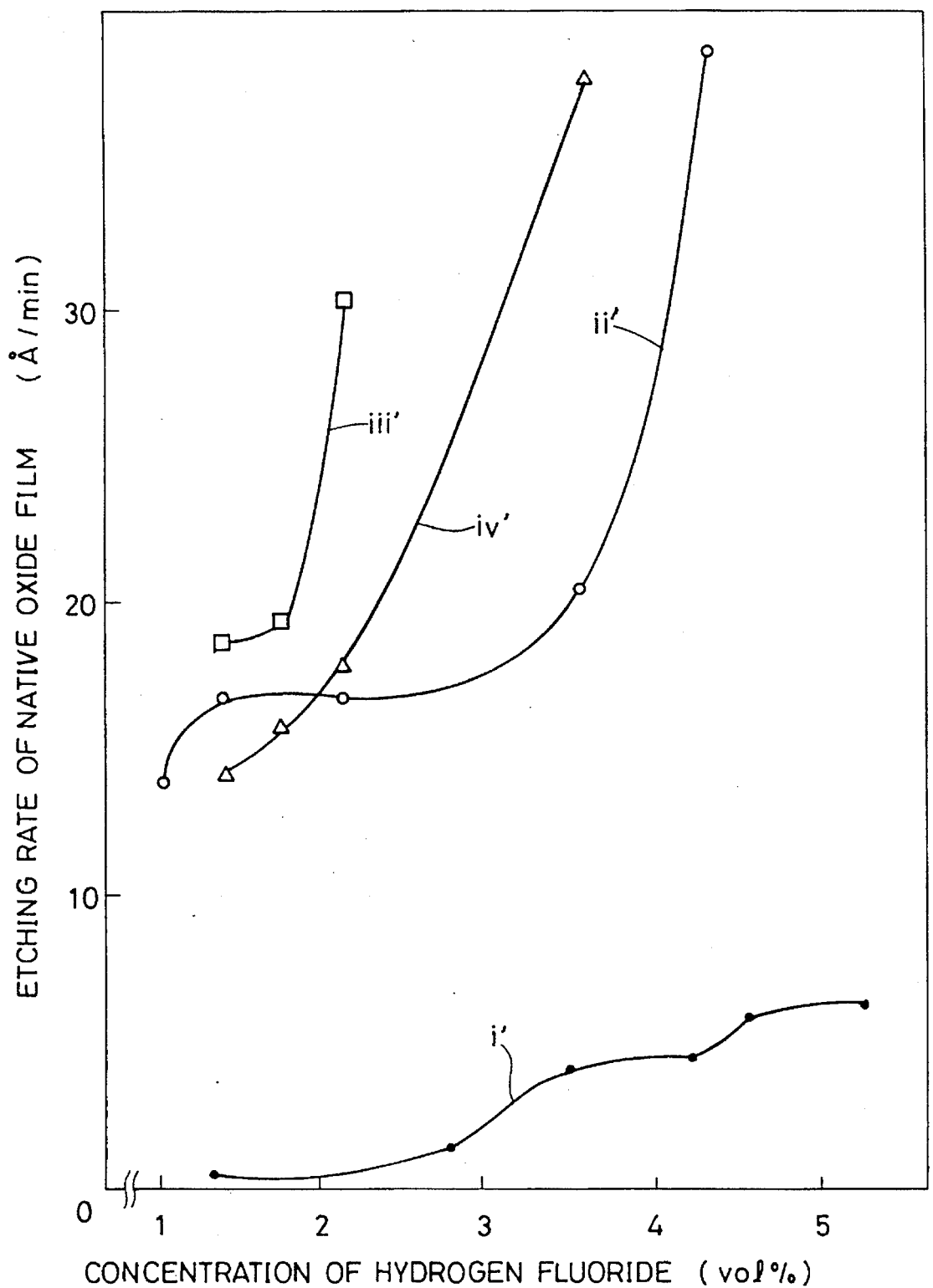
FIG. 6 is a graph showing the results of the second experiment in which a silicon wafer with a native oxide film formed on its surface is etched according to the method of the present invention.

The result is shown in FIG. 6 in the case where silicon wafers with native oxide films formed on their surfaces were etched as samples. In FIG. 6, the curve i' shows the result of a case where only the nitrogen gas was introduced through the line 22, the curve ii' shows the result of a case where methanol vapor was supplied to the container 12 through the line 22 (the curves i' and ii' are the same as the results I' and II' in the test 1), the curve iii' shows the result of a case where ethanol vapor was supplied to the container 12 through the line 22, and the curve iv' shows the result of a case where IPA vapor was supplied to the container 12 through the line 22.

It is appreciated from FIGS. 5 and 6 that the test results are not varied according to the kinds of alcohol used. An excellent etching selectivity (13–16 under optimum conditions) was capable of being obtained when ethanol and isopropyl alcohol were used.

Figure 7:
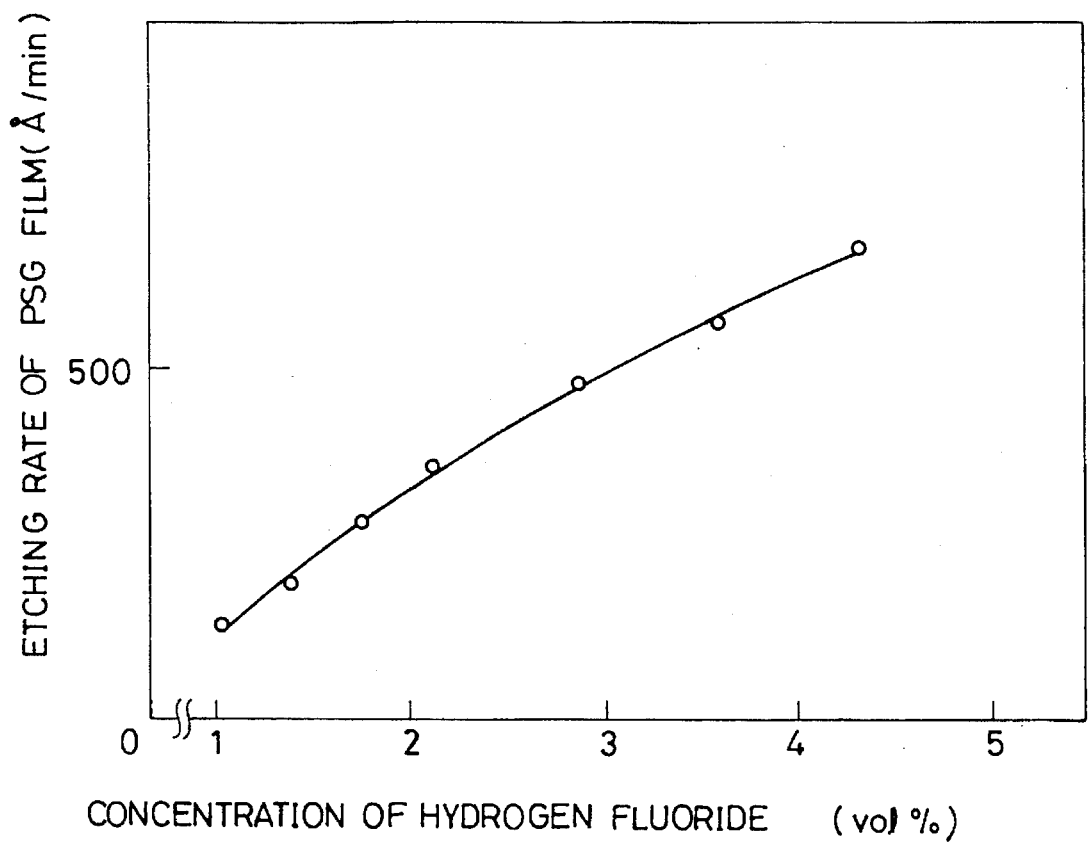
FIG. 7 is a graph showing the results of an experiment in which a silicon wafer with a PSG film formed on its surface is etched according to the method of the present invention.

FIG. 7 shows the result in a case where silicon wafers with PSG films formed on their surfaces were etched under the same conditions as those of the above tests. The curve in FIG. 7 is substantially the same as the curve II of FIG. 3. It can be observed from this test that the method of the present invention is also applicable to a silicon wafer with a PSG film formed thereon.

In the above tests, the concentration of alcohol to be supplied to the container 12 as a whole was set to 8.5–10.2 vol %. The same results were obtained throughout the range of this concentration. Almost the same result is obtained in a alcohol concentration range of 2.5 to 10.2 vol %. Alcohol of a concentration higher than the above range is more liable to form dew on the surface of a silicon wafer, which is not desirable because controlling of etching reaction is difficult. With an alcohol concentration lower than the above range, an etching rate of a BPSG film or a PSG film is increased to approximate value of a case where only the nitrogen gas was introduced though the line 22. On the other hand, an etching rate of a native oxide film is decreased to approximate value of a case where only the nitrogen gas was introduced through the line 22. It is not desirable to lower the alcohol concentration lower than the above range because the etching selectivity, as described above, is increased.

With ethanol used as alcohol, a preferable concentration is 1.0–5.6 vol %, and more preferably it is 2.0–5.6 vol %. With isopropyl alcohol used, a preferable concentration is 0.9–4.2 vol %, and more preferably it is 2.9–4.2 vol %.

For comparison and evaluation, a BPSG film and a native oxide film were etched by a conventional method and etching rates thereof were measured.

Comparison Test 1

Comparison test was conducted by using an apparatus of the same structure as that of the apparatus shown in FIG. 2. In this test, hydrogen fluoride-water mixed solution (commercial product of Hashimoto Chemicals Ltd.) was put in a tank in place of hydrogen-alcohol mixed solution. Nitrogen gas was used as the carrier gas. HF-H$_2$O mixed vapor was supplied to a container in which the silicon wafer was stored and the silicon wafer was etched. At this time, nitrogen gas for dilution was introduced through a path other than a path for supplying HF-H$_2$O mixed vapor to adjust concentration of HF-H$_2$O in the atmosphere in the container. The etching was conducted at a temperature of 22° C., As a result, with an etching rate of a native oxide film set to 10–15Å per minute, the etching rate of a BPSG film was 1000–2000Å per minute. As described in the foregoing, the method using HF-H$_2$O mixed vapor drastically increased the etching rate of the BPSG film and an etching selectivity was as large as 100–200. This method also involved a problem in repeatability because the value of an etching rate was changed a great amount by a slight change of etching conditions.

Comparison Test 2

A second comparison test was conducted in a manner as described in the following. In this test, buffered hydrogen fluoride was stored in a tank for cleansing, which tank is an ordinary commercial product made of Teflon. Silicon wafers were held in an ordinary wafer carrier made of Teflon. The silicon wafers were immersed in the buffered hydrogen fluoride for a predetermined time and etched. The etching was conducted at a temperature of 22° C.

As a result, when the silicon wafer was etched by buffered hydrogen fluoride with 30 weight % ammonium fluoride, 6 weight % of hydrogen fluoride, and 64 weight water, etching rates of the BPSG film and the native oxide film were 700–800Å per minute and 13Å per minute, respectively. The selectivity was 53–61. When the silicon wafer was etched by buffered hydrogen fluoride with 38 weight % ammonium fluoride, 1.5 weight % hydrogen fluoride, and 60.5 weight % of water, the etching rates of the BPSG film and the native oxide film were 200Å per minute and 7Å per minute, respectively. The etching selectivity was about 28. As can be seen from the foregoing, the selectivity was larger in the method using buffered hydrogen fluoride than in the above-described method of the present invention.

Figure 8:
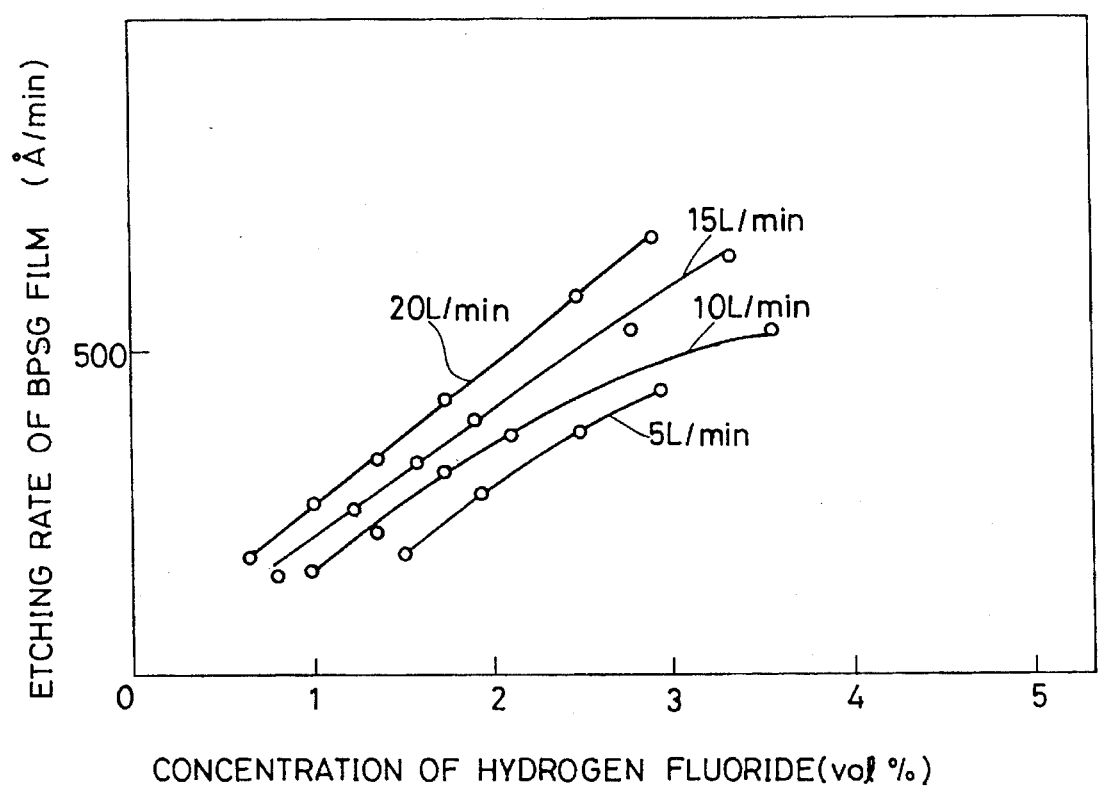
FIG. 8 is a graph showing the results of another experiment in which a silicon wafer with a BPSG film formed on its surface is etched according to the method of the present invention.
Figure 9:
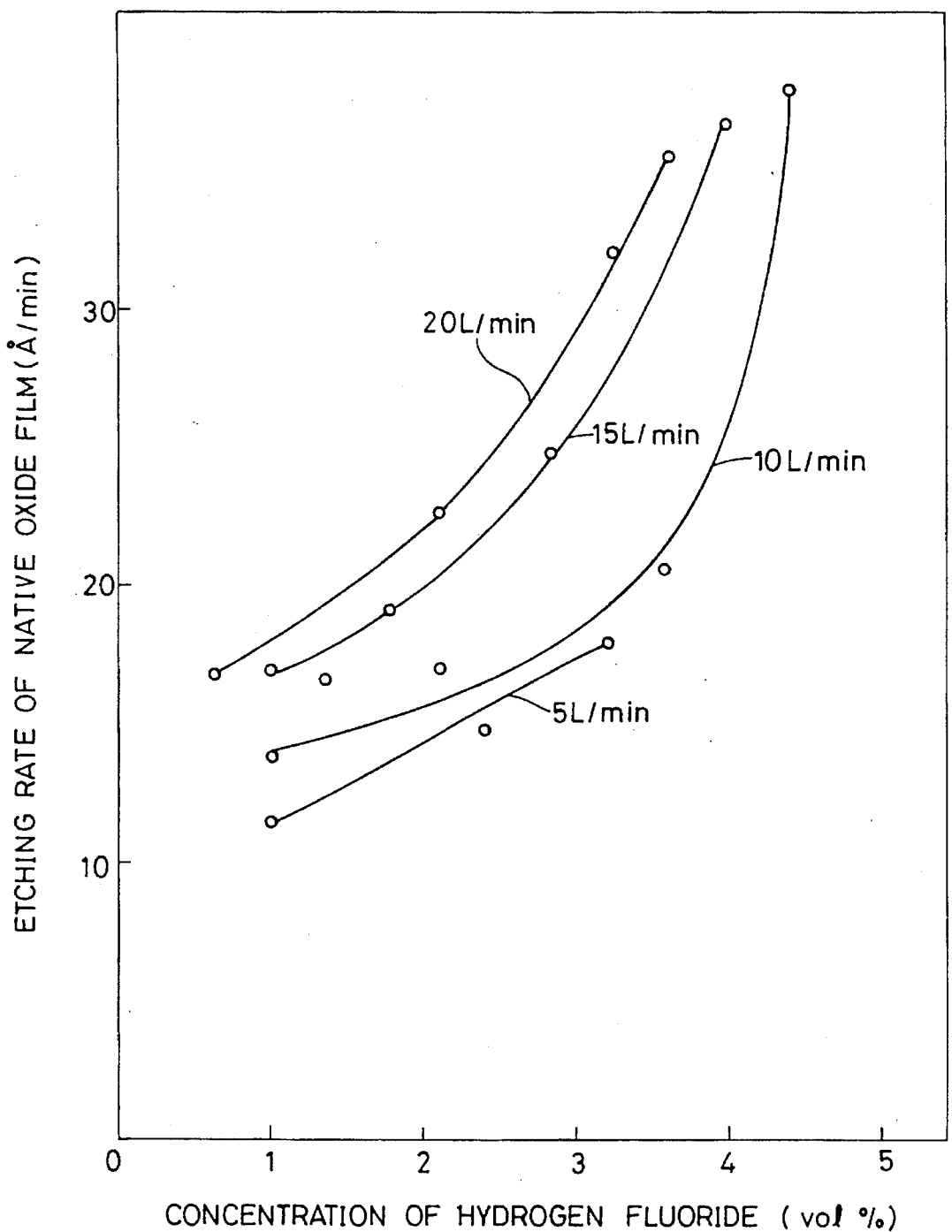
FIG. 9 is a graph showing the results of yet another experiment in which a silicon wafer with a native oxide film formed on its surface is etched according to the method of the present invention.

FIGS. 8 and 9 show test results by using the device shown in FIG. 2 with the carrier gas flow amount changed. In this test, a concentration, as a whole, of the methanol vapor to be supplied to the container 12 was maintained at 8–10 vol %. The BPSG film and the native oxide film on the silicon wafer were etched, with the entire flow amount of nitrogen gas to be introduced to the container 12 as carrier gas, varied such as 5 L per minute, 10 L per minute, 15 L per minute, and 20 L per minute. As is clear from these graphs, although an increase of carrier gas (nitrogen gas) flow amount is followed by an increase in an etching rate of both of the BPSG film and the native oxide film, the etching selectivity is not so greatly changed.

As described in the foregoing, when a native oxide film in a contact hole on a silicon wafer is removed by etching according to the method of the present invention, an etching selectivity of a BPSG film or a PSG film forming an insulation film with respect to a native oxide film can be improved. It is possible to improve quality of a semiconductor device by preventing contact holes from varying in size and avoiding damage to an interface between the silicon wafer surface and the insulation film. With the moisture in an atmosphere suppressed to a small amount, neither undesired side reactions nor reverse reactions of etching are caused in an etching step so as to generate particles. There is no necessity of rinsing a wafer after an etching processing, which makes the operation process simple. Furthermore, unlike conventional wet type etching processing using buffered hydrogen fluoride, the inside of a contact hole is etched by using vapor according to the present invention, so that no particle in solution attaches itself onto a silicon wafer surface and no inorganic/organic impurities re-attached themselves onto the wafer surface. Therefore, none of such problems caused by the foregoing as deterioration of quality occurs. In addition, since hydrogen fluoride vapor easily penetrates into a contact hole having an extremely small diameter, a native oxide film in the contact hole can be efficiently removed. A contact hole can be properly formed and operation characteristics of the device can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of removing a native oxide film that has formed on a main surface of a silicon wafer, said native oxide film being formed in a contact hole in a BPSG film or a PSG film formed on said main surface, said method comprising the steps of:

placing the silicon wafer in a reaction chamber hermetically separated from outside atmosphere, and supplying a mixed vapor including anhydrous hydrogen fluoride and a substantially high concentration of alcohol to said reaction chamber, so as to selectively etch said native oxide film relative to said BPSG or PSG film.

2. The method according to claim 1, wherein said mixed vapor supplying step includes the steps of:

preparing mixed vapor of hydrogen fluoride and alcohol, and introducing said mixed vapor into said reaction chamber through inert gas flow.

3. The method according to claim 2, wherein said alcohol is selected from a group consisting of methanol, ethanol, and isopropyl alcohol.

4. The method according to claim 2, wherein said alcohol includes methanol.

5. The method according to claim 4, wherein said mixed vapor and inert gas include methanol of a concentration of 2.5–10.2 vol %.

6. The method according to claim 5, wherein said mixed vapor and inert gas include methanol of a concentration of 4.0–10.2 vol %.

7. The method according to claim 2, wherein said alcohol includes ethanol.

8. The method according to claim 7, wherein said mixed vapor and inert gas include ethanol of a concentration of 1.0–5.6 vol %.

9. The method according to claim 1, wherein said mixed vapor and inner gas include ethanol of a concentration of 2.0–5.6 vol %.

10. The method according to claim 2, wherein said alcohol includes isopropyl alcohol.

11. The method according to claim 10, wherein said mixed vapor and inert gas include isopropyl alcohol of a concentration of 0.9–4.2 vol %.

12. The method according to claim 11, wherein said mixed vapor and inert gas include isopropyl alcohol of a concentration of 2.9–4.2 vol %.

13. The method according to claim 2, wherein said step of preparing mixed vapor includes the steps of:

preparing a mixed solution of hydrogen fluoride and alcohol in an azeotropic ratio, and generating vapor of said mixed solution.

14. The method according to claim 13, wherein said mixed vapor preparing step further includes the steps of:

preparing substantially high concentration alcohol solution, generating vapor of said high concentration alcohol solution, and introducing said mixed vapor and the vapor of said substantially high concentration alcohol solution to the same flow line and mixing the same by using said inert gas flow.

\* \* \* \* \*